United States Patent
Maki-Ontto et al.

(10) Patent No.: US 11,828,779 B2
(45) Date of Patent: Nov. 28, 2023

(54) APPARATUS FOR MEASURING AN IMPEDANCE OF LOAD

(71) Applicant: Ingersoll-Rand Industrial U.S., Inc., Davidson, NC (US)

(72) Inventors: Petri J. Maki-Ontto, Espoo (FI); Lauri Juhani Salmia, Espoo (FI); Aapo Aapro, Helsinki (FI)

(73) Assignee: INGERSOLL-RAND INDUSTRIAL U.S., INC., Davidson, NC (US)

( * ) Notice: Subject to any disclaimer, the term of this patent is extended or adjusted under 35 U.S.C. 154(b) by 0 days.

(21) Appl. No.: 17/712,466

(22) Filed: Apr. 4, 2022

(65) Prior Publication Data

US 2022/0229100 A1 Jul. 21, 2022

Related U.S. Application Data

(63) Continuation of application No. 16/777,476, filed on Jan. 30, 2020, now Pat. No. 11,293,960.

(30) Foreign Application Priority Data

Jan. 31, 2019 (EP) ..................................... 19154704

(51) Int. Cl.
 *G01R 27/16* (2006.01)
 *G01R 31/34* (2020.01)
(52) U.S. Cl.
 CPC ............. *G01R 27/16* (2013.01); *G01R 31/34* (2013.01)
(58) Field of Classification Search
 CPC ......... G01R 27/16; G01R 31/34; G01R 27/08
 See application file for complete search history.

(56) References Cited

U.S. PATENT DOCUMENTS

| 3,417,331 A | 12/1968 | Gauss, Jr. et al. |
| 4,283,675 A | 8/1981 | Sparber |

(Continued)

FOREIGN PATENT DOCUMENTS

| CN | 102841528 B | 1/2016 |
| JP | 3128674 B2 | 1/2001 |

OTHER PUBLICATIONS

D. Martin et al., "Auto Tuning of Digital Deadbeat Current Controller for Grid Tied Inverters Using Wide Bandwidth Impedance Identification," 2012 Twenty-Seventh Annual IEEE Applied Power Electronics Conference and Exposition (APEC), dated Mar. 9, 2012, pp. 277-284, IEEE, Piscataway, USA.

(Continued)

*Primary Examiner* — Akm Zakaria
(74) *Attorney, Agent, or Firm* — Kevin E. West; Advent, LLP

(57) ABSTRACT

The present application relates to apparatus (400, 500) for measuring an impedance of an electrical load (300) that is configured to be coupled to a controlled current source (200). The apparatus (400, 500) comprises a first coupling node (402) configured to be coupled to a first terminal (302) of the load (300) and a second coupling node (404) configured to be coupled to a second terminal (304) of the load (300). The apparatus further comprises a transformer (406) having a primary winding (408) and a secondary winding (410) and a capacitance (412) connected in series between a first terminal (414) of the secondary winding (410) and the first coupling node (402). A second terminal (416) of the secondary winding (410) is connected to the second coupling node (404). The apparatus further comprises a processing unit (424) is configured to control an excitation signal that is applied to the primary winding (408) so as to cause a variation, corresponding to the excitation signal, in an input current of the load (300), measure the input current (Continued)

and an input voltage of the load (300), and, based on the measured input current and input voltage, determining the impedance of the load (300).

19 Claims, 2 Drawing Sheets

(56) References Cited

U.S. PATENT DOCUMENTS

| | | | |
|---|---|---|---|
| 4,817,011 A * | 3/1989 | Davis | G01R 31/62 |
| | | | 703/2 |
| 5,345,182 A * | 9/1994 | Wakamatsu | G01R 27/06 |
| | | | 324/649 |
| 8,867,975 B2 | 10/2014 | Moriguchi | |
| 9,316,701 B1 | 4/2016 | Salmani et al. | |
| 10,538,165 B2 * | 1/2020 | Dadras | H02J 50/90 |
| 2003/0206021 A1 * | 11/2003 | Laletin | G01R 31/386 |
| | | | 324/426 |
| 2014/0354319 A1 | 12/2014 | Schwartz et al. | |
| 2015/0077141 A1 | 3/2015 | Russ et al. | |
| 2016/0258820 A1 | 9/2016 | Pollock et al. | |
| 2020/0343873 A1 * | 10/2020 | Hrivnak | H03H 7/38 |

OTHER PUBLICATIONS

European Patent Office, Extended European Search Report in corresponding application No. 19154704.1, dated Aug. 19, 2019, 10 pp.

* cited by examiner

APPARATUS FOR MEASURING AN IMPEDANCE OF LOAD

FIELD OF THE INVENTION

The present disclosure relates to an apparatus for measuring an impedance of a load.

BACKGROUND

In electrical systems it is useful to know the impedance and/or frequency response of a load such as an electric motor, in order identify or verify the load to permit accurate control design for the load by control engineers.

In an electric motor system an electric motor a source of electrical power such as an inverter or by a direct online power supply is provided to supply a controlled (e.g. a constant) current to the motor. For accurate control of the motor and prediction of the motor's reaction to system disturbances, an accurate model (often referred to as a motor plant model) describing the behaviour of the motor is required. The motor plant model is dependent upon the operating point (the input voltage, speed and load) of the motor, and so can only be obtained accurately while a rotor of the motor is magnetised and rotating.

In some systems in which the source of electrical power is an inverter, the inverter may perform frequency response analysis for control tuning during or immediately after an "identification run". Systems in which an electric motor is not powered by an inverter, e.g. where the motor is connected to a power supply in a direct online power mode, typically do not perform frequency response analysis.

SUMMARY

The present disclosure describes an apparatus for measuring an impedance of an electrical load (e.g. an electric motor), in which the apparatus can be coupled in parallel with the load and can measure the impedance of the load regardless of the power source of the load. A frequency response of the load can be determined based on the measured impedance.

According to a first aspect, the invention provides apparatus for measuring an impedance of an electrical load that is configured to be coupled to a controlled current source, wherein the apparatus comprises: a first coupling node configured to be coupled to a first terminal of the load; a second coupling node configured to be coupled to a second terminal of the load; a transformer having a primary winding and a secondary winding; a capacitance connected in series between a first terminal of the secondary winding and the first coupling node, wherein a second terminal of the secondary winding is connected to the second coupling node; and a processing unit, wherein the processing unit is configured to: control an excitation signal that is applied to the primary winding so as to cause a variation, corresponding to the excitation signal, in an input current of the load; measure the input current and an input voltage of the load; and based on the measured input current and input voltage, determining the impedance of the load.

The processing unit may be further configured to determine a frequency response of the load based on the determined impedance of the load.

The apparatus may further comprise a controllable switching device configured to selectively couple the primary winding of the transformer to a voltage source so as to apply the excitation signal to the primary winding.

The processing unit may be configured to control operation of the controllable switching device so as to generate the excitation signal.

Alternatively, the apparatus may comprise a controllable AC voltage source coupled to the primary winding of the transformer, wherein the processing unit is configured to control the controllable AC voltage source to generate the excitation signal.

The excitation signal may comprise a sinusoidal sweep signal, for example.

The excitation signal may comprise a chirp signal.

The excitation signal may comprise a pseudo-random binary sequence (PRBS).

The processing unit may be configured to measure the input current and the input voltage of the load for a plurality of different excitation signal frequencies.

The processing unit may be configured to measure the input current and the input voltage of the load at a plurality of different operating points of the load.

The processing unit may comprise a digital signal processor, a microprocessor or a microcontroller.

According to a second aspect, the invention provides a method of operation of the apparatus of the first aspect, the method comprising: coupling the apparatus in parallel a load that is coupled to a controlled current source by coupling the first and second coupling nodes of the apparatus to respective first and second terminals of the load; causing the excitation signal to be applied to the primary winding of the transformer so as so as to cause a variation, corresponding to the excitation signal, in the input current of the load; measuring the input current and the input voltage of the load; and based on the measured input current and input voltage, calculating the impedance of the load.

The method may further comprise determining a frequency response of the load based on the determined impedance of the load.

BRIEF DESCRIPTION OF THE DRAWINGS

Embodiments of the invention will now be described, strictly by way of example only, with reference to the accompanying drawings, of which.

DETAILED DESCRIPTION

Figure 1:
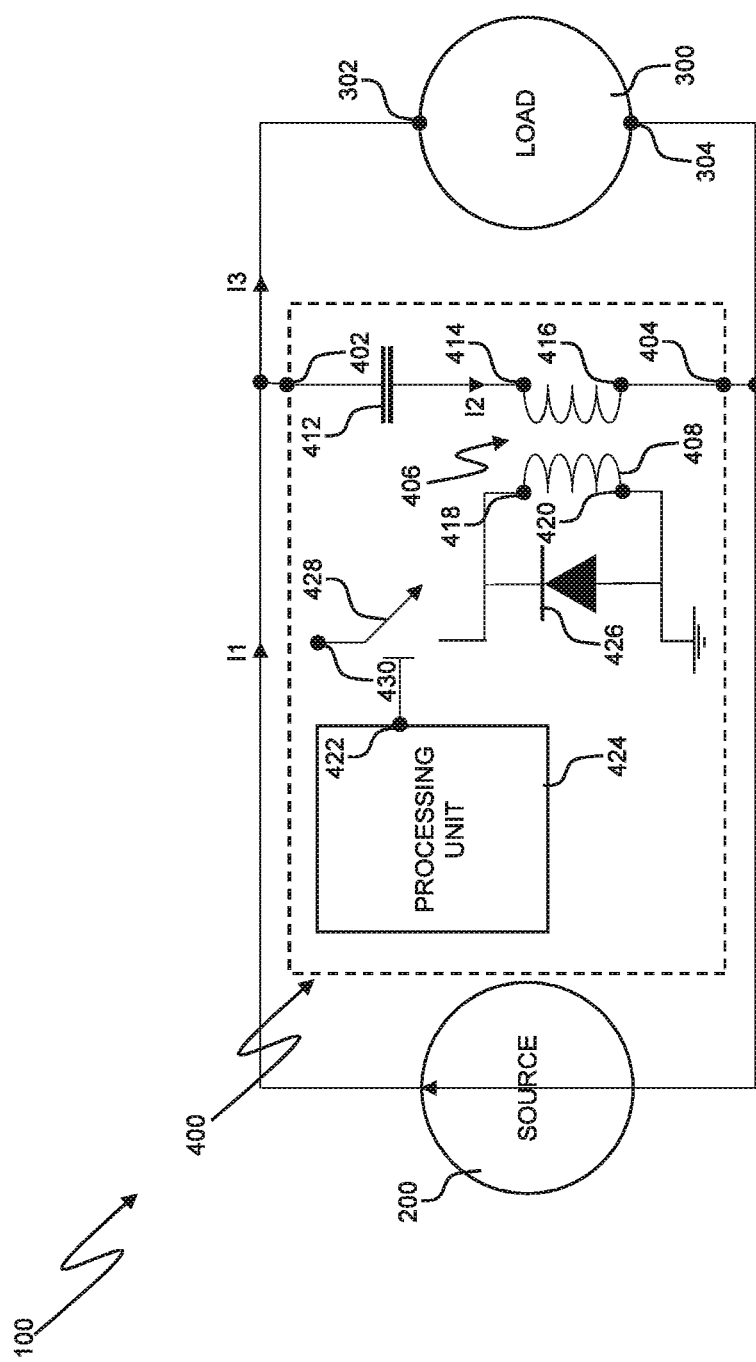
FIG. 1 is a schematic representation of an electrical system including a source and an electrical load, to which an apparatus for measuring an impedance of the electrical load is coupled.

Referring first to FIG. 1, an electrical system is shown generally at 100, and includes a source 200 of electrical power coupled to an electrical load 300. An apparatus 400 for measuring an impedance and determining a frequency response of the electrical load 300 is coupled to the electrical load 300 in a manner that will be explained in more detail below.

The source 200 is a controlled current source, and is operable to output a controlled current to the load 300. The controlled current may be, for example, a constant current. As will be appreciated by those skilled in the art, in order for the source 200 to output a constant current, the current output by the source 200 must be controlled. Thus, in this disclosure the term "controlled current" is to be understood as encompassing a constant current. However, the term "controlled current" is not to be construed as being limited to a constant current. As will be appreciated by those skilled in the art, the source 200 may control many different parameters of current can be controlled. For example, the source 200 may be configured to limit the output current that it outputs to a maximum value.

The electrical load 300 may be, for example, an electric motor. In the discussion that follows an electric motor will be used as an example of a load. However, it will be appreciated by those skilled in the art that the apparatus 400 can be used to measure the impedance, and also to determine the frequency response, of other types of electrical load such as power electronics components, DC-DC converters, inverters, rectifiers and the like.

The apparatus 400 includes a first coupling node 402 and a second coupling node 404, by means of which the apparatus 400 can be coupled to the first and second terminals 302, 304 of the load 300. The first and second terminals 302, 304 of the load 300 are also coupled to the source 200. Thus, the apparatus 400 is coupled in parallel with the source 200 and the load 300.

The apparatus 400 includes a transformer 406 having a primary winding 408 and a secondary winding 410. A capacitance 412 (e.g. a capacitor) is connected in series between the first coupling node 402 and a first terminal 414 of the secondary winding 410. A second terminal 416 of the secondary winding 410 is connected to the second coupling node 404. Thus, the capacitance 412 and the secondary winding 410 are connected in series between the first and second coupling nodes 402, 404.

The primary winding 408 of the transformer 406 has first and second terminals 418, 420. The second terminal is connected to a ground, whilst the first terminal 418 is selectively coupled to voltage source, represented by node 430 in FIG. 1, by means of a controllable switching device 428, which has a control terminal that is coupled to an output 422 of a processing unit 424. A bypass diode 426 is connected in anti-parallel with the primary winding 408, with its anode connected to the second terminal 420 of the primary winding 408 and its cathode connected to the first terminal 418 of the primary winding 408.

The controllable switching device 428 may be, for example, a MOSFET having a gate terminal coupled to the output 422 of the processing unit 424, a source terminal connected to the voltage source 430 and a drain terminal connected to the first terminal 418 of the primary winding 408 of the transformer 406.

The processing unit 424, which may be, for example, a microcontroller, a digital signal processor (DSP), a microprocessor or some other processing unit, is configured to control an excitation signal that is applied to the primary winding 408, by controlling the operation of the controllable switching device 428. When the processing unit 424 outputs a control signal (e.g. a positive voltage) to cause the controllable switching device 428 to switch on, the first terminal 418 of the primary winding 408 is coupled to the voltage source 430, and thus a voltage develops across the primary winding 408. When the processing unit 424 outputs a control signal (e.g. 0 volts) to cause the controllable switching device 428 to switch off, the first terminal 418 of the primary winding 408 is decoupled from the voltage source 430. Thus, by controlling the operation of the controllable switching device 428, the voltage across the primary winding 408 can be controlled to generate a desired voltage waveform across the primary winding 408. This voltage waveform can be regarded as an excitation signal with which the primary winding 408 is excited.

By adjusting the rate at which control signals are output by the processing unit 424 to the control terminal of the controllable switching device 428 the frequency of the excitation signal can be adjusted, and thus, with appropriate control signals, the processing unit 424 can cause a desired excitation signal to be applied to the primary winding 408.

The excitation signal is a time varying electrical signal such as, for example, a swept sinusoid, a chirp signal, a pseudo random binary sequence (PRBS) or some other time varying electrical signal.

When the excitation signal is applied to the primary winding 408 of the transformer 406, a corresponding changing (time varying) voltage develops across the secondary winding 410, which causes a varying current I2 to flow through the capacitor 412. The current I2 combines with a controlled (e.g. constant) current I1 that flows from the source 200 to the load 300 (when the load is operational) to form a current I3. Thus the current I3 includes a time varying component having a frequency corresponding to the frequency of the excitation signal. As the frequency of the excitation signal changes (e.g. where the excitation signal is a swept sinusoid or a chirp signal) the frequency of the time varying component I2 of the current I3 changes accordingly.

The processing unit 424 is configured to measure a voltage across the load 300 and the current I3 through the load and, based on the measured voltage and current, determine or calculate an impedance of the load 300 at the particular operating point of the load 300, by dividing the measured voltage by the measured current. Voltage and current measurements may be taken by the processing unit 424 for a number of different frequencies of the excitation signal, and the impedance of the load 300 at each excitation frequency can be determined or calculated by the processing unit 424. The determined or calculated impedance(s) can then be used by the processing unit 424 to determine the frequency response of the load 300 using known techniques or models that relate the frequency response of the load 300 to its impedance.

For example, where the load 300 is an electric motor, the electric motor may be arranged to operate at a selected operating point by setting the source 200 to output an appropriate current I1 for a selected motor load to achieve a required speed and input voltage. Once the motor is operating at the desired operating point, an excitation signal such as a sinusoidal sweep, a chirp or a PRBS output by the processing unit 424 is applied to the primary winding 408 of the transformer 406 (by controlling the operation of the controllable switching device 428 as described above), so as to inject a current I2 into the system 100. The current I3 through the motor and the voltage across the motor terminals are measured by the processing unit 424 at a plurality of different excitation frequencies, and the impedance of the motor at those different excitation frequencies is determined by the processing unit 424, based on the measured currents and voltages. The processing unit 424 can then determine the frequency response of the motor at the selected operating point based on the determined impedances. In order to characterise or verify the motor more completely, this process may be repeated for a plurality of different selected operating points of the motor.

Figure 2:
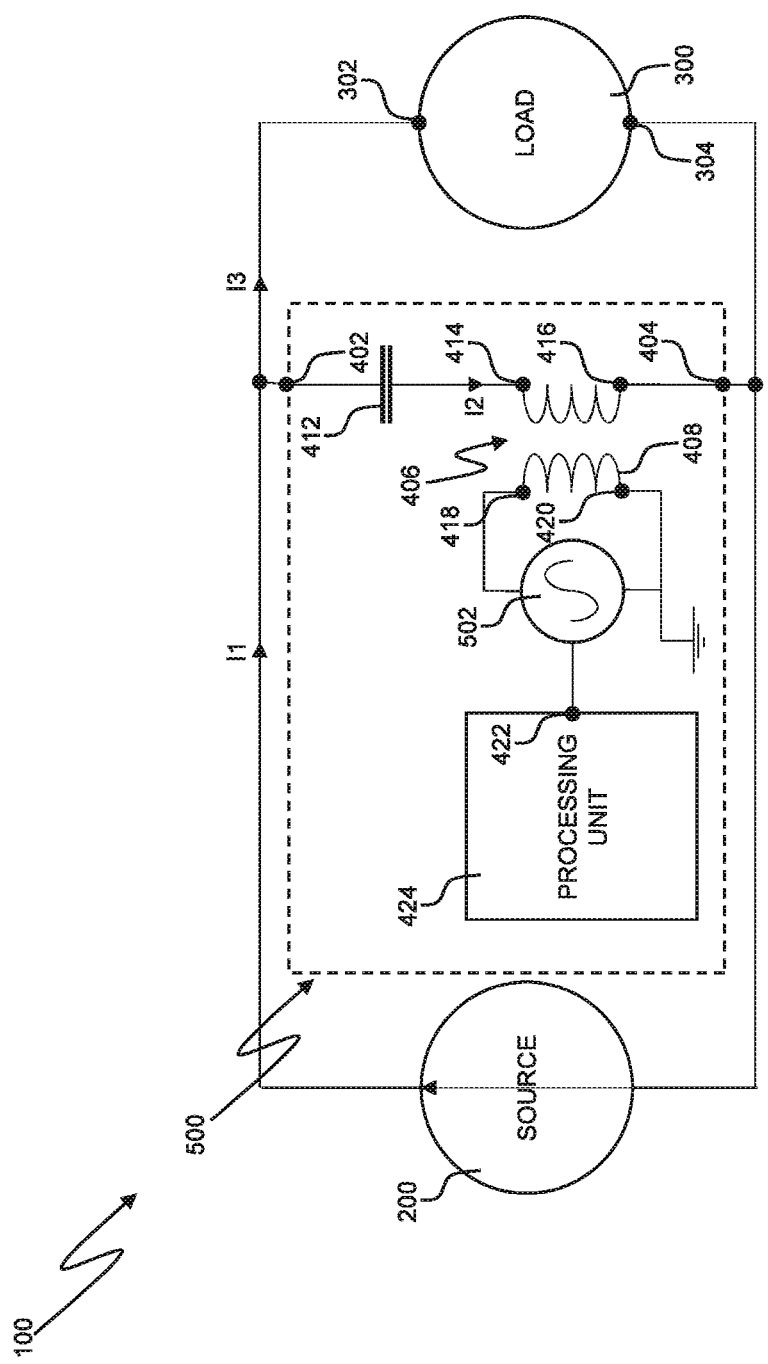
FIG. 2 is a schematic representation of an electrical system including a source and an electrical load, to which an alternative apparatus for measuring an impedance of the electrical load is coupled.

Referring now to FIG. 2, an alternative apparatus for measuring a frequency response of an electrical load electrical system is shown generally at 500, coupled to a controlled current source 200 and an electrical load 300 in the same manner as the apparatus 400 of FIG. 1. The alternative apparatus 500 includes a number of elements that are the same as elements of the apparatus 400, and so like elements in FIGS. 1 and 2 are denoted by like reference numerals.

The alternative apparatus 500 differs from the apparatus 400 of FIG. 1 in that the bypass diode 426 and the controllable switching device 428 are replaced by a controllable AC voltage source 502 coupled to the output 422 of the processing device 424.

In operation of the alternative apparatus 500, the processing unit 424 controls the controllable 502 AC voltage source to output an excitation signal in the form of an AC voltage to the first winding 408 of the transformer 406, which induces an alternating voltage across the secondary winding 410, causing a varying current I2 to flow through the capacitor 412. As in the apparatus 400 of FIG. 1, the current I2 combines with a current I1 that flows from the source 200 to the load 300 (when the load is operational) to form a current I3. Thus the current I3 includes a component having a frequency corresponding to the frequency of the excitation signal. The processing unit 424 may control the controllable voltage source 502 so as to produce an excitation signal whose frequency varies over time, e.g. a swept sinusoid or a chirp signal. As the frequency of the excitation signal changes the frequency of the I2 component of the current I3 changes accordingly.

As in the apparatus 400 of FIG. 1, the processing unit 424 is configured to measure a voltage across the load 300 and the current I3 through the load and, based on the measured voltage and current, determine or calculate an impedance of the load 300 at the particular operating point of the load 300. Voltage and current measurements may be taken by the processing unit 424 for a number of different frequencies of the excitation signal, and the impedance of the load 300 at each excitation frequency can be determined or calculated by the processing unit 424. The determined or calculated impedance(s) can then be used by the processing unit 424 to determine the frequency response of the load 300 using known techniques.

As will be appreciated from the foregoing, the apparatus 400, 500 disclosed herein and illustrated in the accompanying Figures provides a cost effective mechanism for determining the impedance and frequency response of a load coupled to a controlled current (e.g. a constant current) source during operation of the load, thus facilitating accurate identification and verification of the load and permitting accurate control design for the load by control engineers. It will be noted that the apparatus 400, 500 described above and illustrated in the accompanying Figures can be used regardless of the source 200. For example, the apparatus 400, 500 can be used in electrical systems that use a rectifier as a current source, and in electrical systems that operate in a direct online mode.

Whilst in the disclosure above an electric motor is discussed as an example of a load, but it will be appreciated by those skilled in the art that the apparatus 400, 500 of the present disclosure can be used to measure the frequency response of other types of electrical load such as power electronics components. DC-DC converters, inverters, rectifiers and the like. Moreover, whilst in the discussion above a single phase motor is given as an example of a load, the apparatus (400, 500) of the present disclosure is equally suitable for use with a three-phase electric motor, in which case the impedance per phase can be characterised as described above by using one apparatus per phase. Additionally or alternatively, three-phase analysis methodologies such as the DQ-transformation can be used to calculate impedance in a rotational-synchronous coordinate system.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality. Any reference signs in the claims shall not be construed so as to limit their scope.

The invention claimed is:

1. An apparatus for measuring an impedance of an electrical load, wherein the electrical load is configured to be coupled with a current source that supplies an input current to the electrical load between a first terminal and a second terminal of the electrical load, the apparatus comprising:
   a transformer having a primary winding and a secondary winding, the secondary winding is configured to be coupled to the current source in parallel with the electrical load;
   a capacitance coupled in series with the secondary winding and configured to be coupled in parallel with the electrical load when the secondary winding is coupled to the current source; and
   a processing unit, wherein the processing unit is configured to:
      control an excitation signal that is applied to the primary winding so as to cause a variation, corresponding to the excitation signal, in the input current of the electrical load;
      measure the input current and an input voltage of the electrical load; and
      based on the measured input current and the measured input voltage, determine the impedance of the electrical load.

2. The apparatus according to claim 1, wherein the processing unit is further configured to determine a frequency response of the electrical load based on the determined impedance of the electrical load.

3. The apparatus according to claim 1, further comprising a controllable switching device configured to selectively couple the primary winding of the transformer to a voltage source so as to apply the excitation signal to the primary winding.

4. The apparatus according to claim 3, wherein the processing unit is configured to control operation of the controllable switching device so as to generate the excitation signal.

5. The apparatus according to claim 1, wherein the apparatus comprises a controllable AC voltage source coupled to the primary winding of the transformer, wherein the processing unit is configured to control the controllable AC voltage source to generate the excitation signal.

6. The apparatus according to claim 1, wherein the excitation signal comprises a sinusoidal sweep signal.

7. The apparatus according to claim 1, wherein the excitation signal comprises a chirp signal.

8. The apparatus according to claim 1, wherein the excitation signal comprises a pseudo-random binary sequence (PRBS).

9. The apparatus according to claim 1, wherein the processing unit is configured to measure the input current and the input voltage of the electrical load for a plurality of different excitation signal frequencies.

10. The apparatus according to claim 1, wherein the processing unit is configured to measure the input current and the input voltage of the electrical load at a plurality of different operating points of the electrical load.

11. The apparatus according to claim 1, wherein the processing unit comprises a digital signal processor, a microprocessor, or a microcontroller.

12. A method of operation of an apparatus comprising:
a first coupling node;
a second coupling node;
a transformer having a primary winding and a secondary winding;
a capacitance connected in series between a first terminal of the secondary winding and the first coupling node, wherein a second terminal of the secondary winding is connected to the second coupling node;
the method comprising:
coupling the apparatus to a current source in parallel with an electrical load, wherein the electrical load is coupled to the current source that supplies an input current to the electrical load between a first terminal and a second terminal of the electrical load, wherein coupling the apparatus to the current source in parallel with the load includes coupling the first and second coupling nodes of the apparatus to the respective first and second terminals of the electrical load;
applying an excitation signal, via a processing unit of the apparatus, to the primary winding of the transformer so as to cause a variation, corresponding to the excitation signal, in the input current of the electrical load;
measuring, via the processing unit, the input current and an input voltage of the electrical load; and
based on the measured input current and the measured input voltage, calculating, via the processing unit, an impedance of the load.

13. The method according to claim 12, further comprising determining a frequency response of the electrical load based on the calculated impedance of the electrical load.

14. An apparatus for measuring an impedance of an electrical load, wherein the electrical load is configured to be coupled with a current source that supplies an input current to the electrical load between a first terminal and a second terminal of the electrical load, the apparatus comprising:
a transformer having a primary winding and a secondary winding, the secondary winding is configured to be coupled to the current source in parallel with the electrical load;
a capacitance coupled in series with the secondary winding and configured to be coupled in parallel with the electrical load when the secondary winding is coupled to the current source; and
a processing unit, wherein the processing unit is configured to determine the impedance of the electrical load based on a measurement of the input current and an input voltage to the electrical load.

15. The apparatus according to claim 14, wherein the processing unit is configured to control an excitation signal that is applied to the primary winding so as to cause a variation, corresponding to the excitation signal, in the input current of the electrical load.

16. The apparatus according to claim 14, wherein the processing unit is further configured to determine a frequency response of the electrical load based on the determined impedance of the electrical load.

17. The apparatus according to claim 15, further comprising a controllable switching device configured to selectively couple the primary winding of the transformer to a voltage source so as to apply the excitation signal to the primary winding.

18. The apparatus according to claim 17, wherein the processing unit is configured to control operation of the controllable switching device so as to generate the excitation signal.

19. The apparatus according to claim 15, wherein the apparatus comprises a controllable AC voltage source coupled to the primary winding of the transformer, wherein the processing unit is configured to control the controllable AC voltage source to generate the excitation signal.

* * * * *